United States Patent
Kannengiesser et al.

(10) Patent No.: US 8,624,596 B2
(45) Date of Patent: Jan. 7, 2014

(54) METHOD FOR DETERMINING MOTION PARAMETERS OF AN OBJECT IN A MAGNETIC FIELD

(75) Inventors: Stefan Kannengiesser, Wuppertal (DE); Tobias Kober, Lausanne (CH); Gunnar Krueger, Lausanne (CH)

(73) Assignee: Siemens Aktiengesellschaft, Munich (DE)

(*) Notice: Subject to any disclaimer, the term of this patent is extended or adjusted under 35 U.S.C. 154(b) by 513 days.

(21) Appl. No.: 12/883,347

(22) Filed: Sep. 16, 2010

(65) Prior Publication Data
US 2011/0080167 A1 Apr. 7, 2011

(30) Foreign Application Priority Data
Oct. 2, 2009 (EP) .................................... 09172108

(51) Int. Cl.
*G01V 3/00* (2006.01)
(52) U.S. Cl.
USPC ........................................................ 324/309
(58) Field of Classification Search
USPC ................................................ 324/300–322
See application file for complete search history.

(56) References Cited

U.S. PATENT DOCUMENTS

| 6,230,040 B1* | 5/2001 | Wang et al. ................... 600/415 |
| 6,593,741 B2* | 7/2003 | Bydder et al. ................. 324/307 |
| 6,950,543 B2* | 9/2005 | King et al. .................... 382/128 |
| 2008/0214923 A1 | 9/2008 | Krueger et al. |
| 2013/0113486 A1* | 5/2013 | Imamura et al. .............. 324/322 |

FOREIGN PATENT DOCUMENTS

DE 10 2006 055 933 A1 6/2008

* cited by examiner

*Primary Examiner* — Dixomara Vargas
(74) *Attorney, Agent, or Firm* — Laurence A. Greenberg; Werner H. Stemer; Ralph E. Locher

(57) ABSTRACT

A method for determining motion parameters of an object by way of at least one coil within a magnetic field adapted for a magnetic resonance based imaging device. Induced pulses are emitted on the coil in order to provide navigator signals that are finally measured in order to provide a spatial position of the object relative to the coil. At least one reference displacement of the object relative to the coil that is spatially and metrically predefined between two positions of the object is generated so that intensity changes of navigator signals at the coil are measured and recorded in a calibration map. Then, for determining each one of a sequence of further positions of an object in motion relatively to the coil, a navigator signal of the coil is measured and is compared to values of intensity changes from the calibration map in order to provide a corrected value of displacement of the object that is recovered from the calibration map and processed so that absolute values of motion parameters of the object are determined.

6 Claims, 3 Drawing Sheets

METHOD FOR DETERMINING MOTION PARAMETERS OF AN OBJECT IN A MAGNETIC FIELD

CROSS-REFERENCE TO RELATED APPLICATION

This application claims the priority, under 35 U.S.C. §119, of European patent application EP 09172108, filed Oct. 2, 2009; the prior application is herewith incorporated by reference in its entirety.

BACKGROUND OF THE INVENTION

Field of the Invention

The invention relates to a method for determining a free motion of an object in a magnetic field, especially adapted for a magnetic resonance (MR) based imaging device.

Magnetic resonance imaging (MRI) acquisitions are often sensitive to subject motion. In particular, imaging protocols that acquire data over the course of several minutes (e.g. anatomy) are often compromised. Consequently, a number of motion detection and correction schemes have been proposed recently.

One technique makes use of the fact that a MR-signal strength detected in interaction with at least one local coil element (which is placed close to the object to be imaged over the MRI) changes as a function of object distance between an MR-detector and the local coil. Such a coil based technique is described in commonly assigned U.S. Patent application publication No. US 2008/0214923 A1 and in German published patent application DE 10 2006 055 933 A1. There, the positions of each one of a set of coils that are placed all around the head of a body are spatially determined by means of the above mentioned technique.

Thus, the use of high-channel count receive-coils with good coverage of a scanned object over a MRI may provide enough sensitivity to detect some motion parameters of a rigid body like a phantom.

However a motion introduces image artifacts, especially by smooth bodies (=no rigid like a human body under a MRI-scan). Such artifacts severity depends on a used acquisition scheme, a sampled k-space position when motion appears and a amplitude of motion. The longer a MRI scan time is, the higher is a chance that such an artefact occurs. Although a number of strategies have been proposed and implemented to minimize a motion, the sensitivity of MR-signals due to the motion is still a significant limitations in many MR-schemes. Recently, a method has been proposed to detect motion using so called FID (=free induction decay) navigator MR-signals from multi-channel coils (e.g. 12 or 32-channel head). During dynamic monitoring of FID navigator MR-signals (e.g. immediately after each induced Radio-Frequency-RF-pulse within a structural scan of an object), a motion of said object will introduce unexpected changes (as a kind of artefacts) of a received integral signal in a single coil element placed on the object when compared to a reference signal (e.g. signal after a first common RF-pulse without distortion or saturation). Hence through a well known spatial distribution of multiple coil elements, motion parameters of object can be derived (see the above-mentioned US 2008/0214923 A1 and DE 10 2006 055 933 A1), but are however still subject to the related artefacts.

SUMMARY OF THE INVENTION

It is accordingly an object of the invention to provide a method of determining movement parameters of an object in a magnetic field which overcomes the above-mentioned disadvantages of the heretofore-known devices and methods of this general type and which minimizes the above mentioned artefacts in measured navigator signals that occur by a displacement of at least one coil.

With the foregoing and other objects in view there is provided, in accordance with the invention, a method for determining motion (or movement) parameters of an object by way of at least one coil within a magnetic field adapted for a magnetic resonance based imaging device, the method which comprises:

emitting induced pulses on the coil in order to provide navigator signals that are finally measured in order to provide a spatial position of the object relative to the coil;

generating at least one reference displacement of the object relative to the coil that is spatially and metrically predefined between two positions of the object, so that intensity changes of navigator signals at the coil are measured and recorded in a calibration map;

for determining each one of a sequence of further positions of an object in motion relative to the coil, measuring a navigator signal of the coil and comparing to values of intensity changes from the calibration map in order to provide a corrected value of displacement of the object that is recovered from the calibration map and processed, to thereby determine absolute values of motion parameters of the object.

For that purpose it is proposed to calibrate/scale changes in navigator signal intensity based on a motion-induced free induction decay (FID) signals change in receiving coil arrays with negligible impact on scanning performance. Mainly, the calibration will be provided by scanning an object or a subject which is moved in units of translation (mm) or rotation (degree) relative to the coil(s). Due to that induced motion, sensitive profile of coils signal are subjected to changes which can be associated to special foreseen artefacts. By reversely introducing the knowledge of these changes in a real measurement of an object, the artefacts can be compensated in the imaging of the object.

The invention makes use of a so-called calibration map that comprises "coil scaling sensitivity maps" —similar to or as coil sensitivity maps acquired during a parallel imaging—to introduce a scaling of signal changes in coil elements to units of a relative motion (mm translation and degree rotation) between said object, like a phantom, and the coil(s). These maps provide a sensitivity profile for each coil element (ideally in 3D) in term of navigator signal intensity and correspondingly in term of a position/displacement to be determined. In addition, the invention permits to reconstruct a (low-resolution) image of an imaged object with the determined positions of one or more coils. Using a common "k-space" or other image transformations, it is hence possible to introduce or simulate well defined motion (here in term of translation or rotation) that applies on an imaged object over a MR. In a next step, the "moved" object can be directly mapped to previously calculated coil profiles from a map. By integrating the signal "seen/provided" by each individual coil before and after a simulated motion, a scaling of signal changes in coil elements to motion parameters can be advantageously obtained. Hence the signal sensitivity that is subject to alteration due to artifacts over a motion of the object relative to coils can be less disturbed/distorted.

In accordance with the claimed invention, we present such a method for determining free motion parameter of an object by means of at least one coil in a magnetic field adapted for a magnetic resonance based imaging device. A set of dependent claims is providing further technical features related to possible advantageous embodiments of the invention.

By this way, the invention proposes a method for determining a free motion of at least a part of the object to be imaged relative to at least one coil (spatially closed to said object) in a magnetic field adapted for a magnetic resonance based imaging device. Induced pulses from the coils are emitted in order to provide navigator signals that are finally measured in order to provide a spatial position of the coil and consequently of the associated object (relative to the coils) in a spatial coordinate system of the imaging device.

The method according to the invention is mainly characterized in that:

at least one reference displacement of the object relative to the coil that is spatially and metrically predefined between two positions (P1, P2 . . . ) of the object is generated so that intensity changes of navigator signals (NS1, NS2 . . . ) at the coil are measured and recorded in a calibration map (M1, M2 . . . ), for determining each one of a sequence of further positions of an object in motion relatively to the coil, a navigator signal of the coil is measured and is compared to values of intensity changes from the calibration map in order to provide a corrected value of displacement of said object that is recovered from said calibration map and processed so that absolute values of motion parameters of the object are determined.

By correcting the value of displacement, artifacts due to a sensitivity distortion of navigator signals caused by the motion of object can be easily and immediately compensated over the maps. Long correction processes or, at worst a new imaging scan can be hence advantageously avoided.

The experiment has shown that one part of said reference displacement can be provided over a translation of the object relative to the coil, ideally under a straight motion step of 1 mm (up to 2 mm) for e.g. an imaging of a human head. By this way a change of absolute motion parameters of the imaged head can be detected very accurately at least by a 1 mm-resolution.

In the same way it is additively or alternatively recommended that one part of the reference displacement is provided over a rotation of the object relative to the coil, ideally under an angular motion step of 1° (until 2°) for e.g. an imaging of a human head. By this way a change of absolute motion parameters of the imaged head can be detected very accurately at least by a 1°-angle resolution.

In a preferred embodiment of the invention, the sensitivity profile of navigator signals of each coil can be easily recorded by means of 2D- or 3D-tables in the calibration map according to measured intensity changes of said navigator signals and displacement values. It is hence possible to access correction values of possible corrupted absolute motion parameters in real time.

In resume, since such the method according to the invention can be incorporated without significant time-penalty and it is contrast-independent, it can be applied to various imaging and spectroscopy techniques prone to foreseen motion artefacts. Combining FID signal changes and coil sensitivity maps may even allow a back-calculation of absolute motion parameters.

In order to provide said one part of the reference displacement by means of a translation of the object relative to at least one coil, a step shift motor can be used during a MR-Imaging that provides a series of intensity records in order to fill the calibration map. By associating a further step rotating motor to generate one other part of the reference displacement a rotation of the object relative to at least one coil can be also provided.

Other features which are considered as characteristic for the invention are set forth in the appended claims.

Although the invention is illustrated and described herein as embodied in a method for determining motion parameters of an object in a magnetic field, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of a specific embodiment when read in connection with the accompanying drawing.

DETAILED DESCRIPTION OF THE INVENTION

Figure 1:
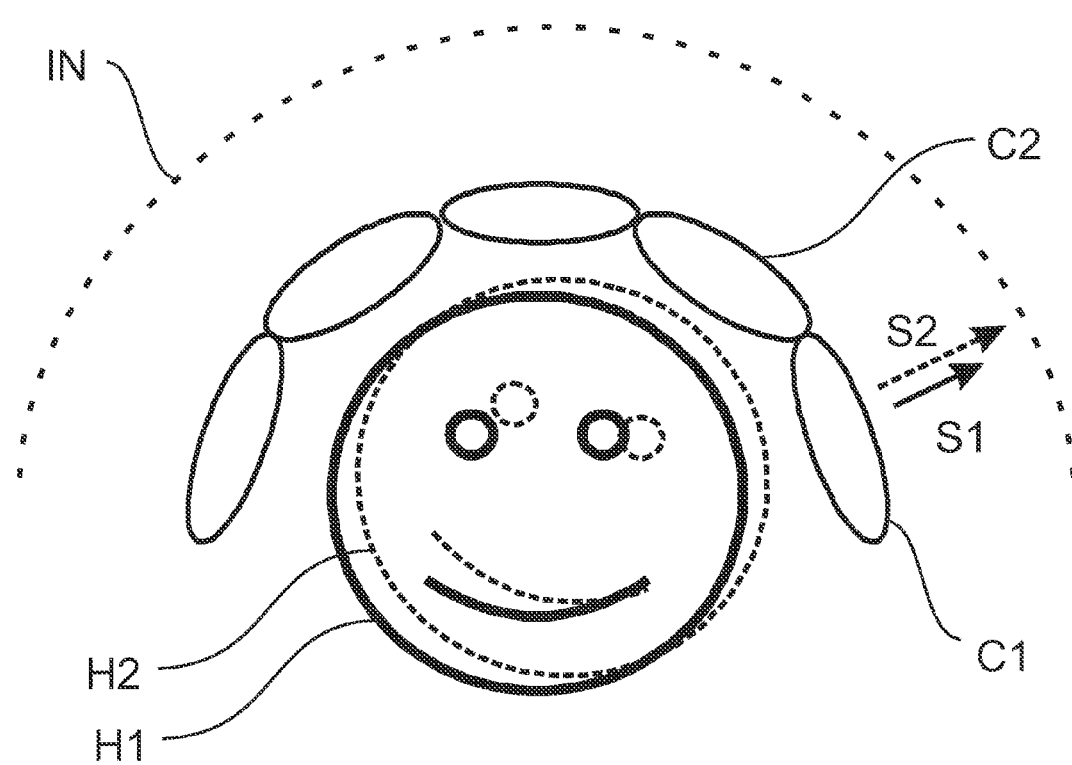
FIG. 1 is a schematic view of a set of coils with an object (human head) in motion in a magnetic resonance field, wherein the method according to the invention can be applied.

Referring now to the FIG. 1 of the drawing in detail, there is shown, schematically, a set of five coils C1, C2 . . . that are placed in a magnetic resonance based imaging device IN, whereby the method according to the invention can be applied.

A magnetic resonance field is generated by the device IN that is able to image in- and out-parts of an object H1, H2 (phantoms, human part of body, such as the illustrated human head, etc.) as well as to detect and measure navigator signals (S1, S2 . . . ) of said coils that are located around the head. Over the motion of the head relative to the coils due to adapted motorized elements by calibrating/simulating or due to intrinsically movements of said object by a real measurement, at least the navigator signals S1, S2 from the coils C1 are measured to estimate the distance between said coil and a receiver of the imaging device IN. By using a plurality of coils that are spatially separated and distributed on the object, a determination of several coil positions can hence provides a spatially unequivocal (or/and enhanced) determination of said coils as well as of the position/orientation of the object in an absolute coordinate system of imaging device IN.

The method includes following steps:

at least one reference displacement that is spatially and metrically predefined between two positions (H1, H2 . . . ) of the object coil is generated so that at least intensity values of two navigator signals (S1, S2 . . . ) are measured and recorded in at least one calibration map (here for reason of clarity, only for the coil C1 but it is supposed that it will be proceeded as well for all other coils in order to complete said calibration map);

such reference displacements and associated measurements of variations of intensities due to artefacts in term of sensitive deviation of navigation signals can be repeated by shifting or/and rotating the object over a calibration plane or a calibration volume contained in the imaging scope of the device IN so that the calibration maps of a coil can be completed under a predefined resolution (for body parts, by 1 mm or/and 1°) and by many locations or positions in the calibration plane or volume. By this way 2D- or 3D-maps can be created in order to achieve a final calibration/simulation;

at the end of said calibration, a final calibration map that covers all individual artefacts related maps can be also provided in order to enhance the spatial precision or/and unequivocity of a further spatial determination of the absolute motion parameter of the object;

in a further stage of real measurement, that means for effectively determining each one of a free unpredetermined sequence of positions of a living object in motion relative to the coils, each navigator signal of the coil is then measured including possible artefacts and this signal values are compared to signal/intensity/changes values in the calibration map that refer to known referenced positions so that a displacement value between at least two said referenced positions is recovered from said calibration map.

This way of proceeding over such "coil scaling sensitivity maps" allows very advantageously to compensate an artefact due to a sensitivity distortion of one or more navigator signals caused by a free motion. The maps permits to detect and to quantify the exact motion of object by recognising a plurality of possible simultaneous artifacts over the knowledge of previous calibration steps.

The method according to the invention can also involve a calibration of navigator signal intensity changes in consecutive MR-scans of one or all coils to determine absolute motion parameters (here translation and rotation) of an object to be located and imaged by means of reverse-map based corrections. Such a goal requires:

at least an acquisition of some "coil scaling sensitivity maps" on which a processing (mathematical procedure/algorithm) is performed in order to simulate and register signal changes as caused by possible reference motions, to perform a calibration on these signal changes according to the previous method involving calibration maps, to provide an analysis of real signal changes in consecutive scans (e.g. in structural imaging) to derive motion parameters of the coils or an object by means of the calibrated maps of signal changes.

Over such reference measured signal changes within associated maps, "coil scaling high sensitivity maps" are generated and the position of objects can be determined with a higher accuracy including an effective compensation of disturbing artifacts' effects.

Figure 2:
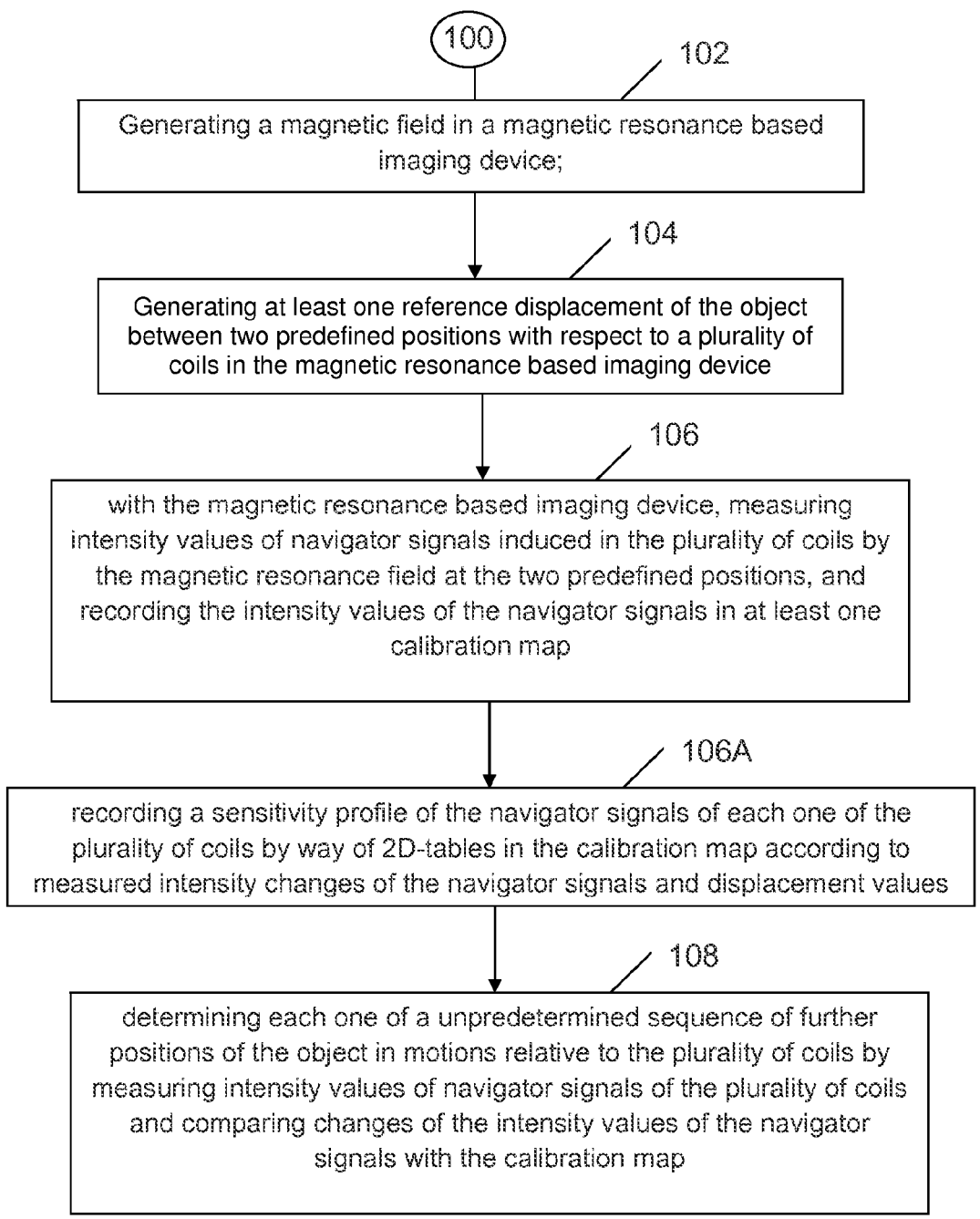
FIG. 2 is a flowchart illustrating steps of an exemplary embodiment of a method.

FIG. 2 is a flowchart illustrating an exemplary embodiment of the inventive method 100. Step 102 includes generating a magnetic resonance field in a magnetic resonance based imaging device. Step 104 includes generating at least one reference displacement of the object between two predefined positions with respect to a plurality of coils in the magnetic resonance based imaging device. Step 106 includes with the magnetic resonance based imaging device, measuring intensity values of navigator signals induced in the plurality of coils by the magnetic resonance field at the two predefined positions, and recording the intensity values of the navigator signals in at least one calibration map. Optional step 106A includes recording a sensitivity profile of the navigator signals of each one of the plurality of coils by way of 2D-tables or 3D-tables in the calibration map according to measured intensity changes of the navigator signals and displacement values. Step 108 includes determining each one of a unpredetermined sequence of further positions of the object in motion relative to the plurality of coils by measuring intensity values of navigator signals of the plurality of coils and comparing changes of the intensity values of the navigator signals with the calibration map.

Figure 3:
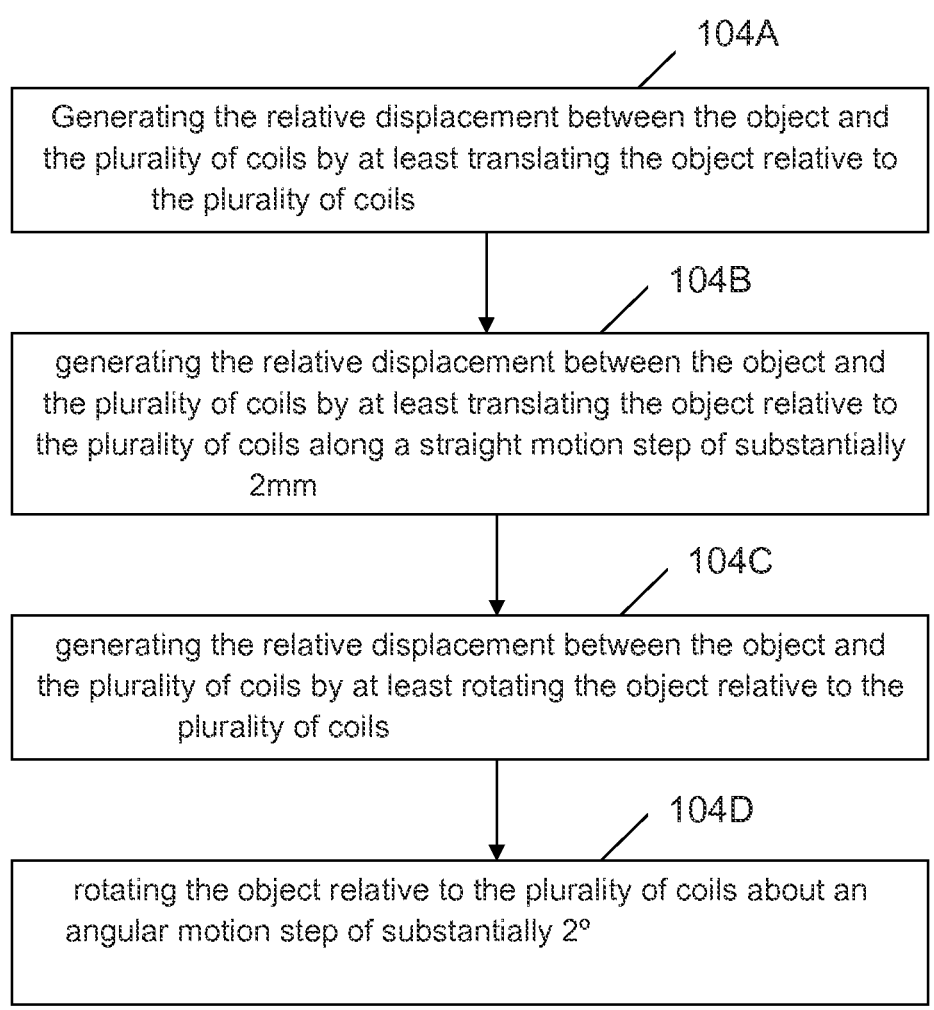
FIG. 3 is a flowchart illustrating possible steps of the exemplary embodiment of the method.

FIG. 3 is a flowchart illustrating steps that may be performed when performing step 104 of the inventive method 100. Step 104A includes generating the relative displacement between the object and the plurality of coils by at least translating the object relative to the plurality of coils. Step 104B includes generating the relative displacement between the object and the plurality of coils by at least translating the object relative to the plurality of coils along a straight motion step of substantially 2 mm. Step 104C includes generating the relative displacement between the object and the plurality of coils by at least rotating the object relative to the plurality of coils. Step 104D includes rotating the object relative to the plurality of coils about an angular motion step of substantially 2°.

The invention claimed is:

1. A method for determining motion parameters of an object in a magnetic resonance based imaging device, the method which comprises:
   generating a magnetic resonance field in a magnetic resonance based imaging device;
   generating at least one reference displacement of the object between two predefined positions with respect to a plurality of coils in the magnetic resonance based imaging device;
   with the magnetic resonance based imaging device, measuring intensity values of navigator signals induced in the plurality of coils by the magnetic resonance field at the two predefined positions, and recording the intensity values of the navigator signals in at least one calibration map;
   determining each one of a unpredetermined sequence of further positions of the object in motion relative to the plurality of coils by measuring intensity values of navigator signals of the plurality of coils and comparing changes of the intensity values of the navigator signals with the calibration map.

2. The method according to claim 1, which comprises generating the relative displacement between the object and the plurality of coils by at least translating the object relative to the plurality of coils.

3. The method according to claim 2, which comprises generating the relative displacement between the object and the plurality of coils by at least translating the object relative to the plurality of coils along a straight motion step of substantially 2 mm.

4. The method according to claim 1, which comprises coil generating the relative displacement between the object and the plurality of coils by at least rotating the object relative to the plurality of coils.

5. The method according to claim 4, which comprises rotating the object relative to the plurality of coils about an angular motion step of substantially 2°.

6. The method according to claim 1, which comprises recording a sensitivity profile of the navigator signals of each one of the plurality of coils by way of 2D-tables or 3D-tables in the calibration map according to measured intensity changes of the navigator signals and displacement values.

* * * * *